United States Patent
Shi et al.

(10) Patent No.: US 7,439,538 B2
(45) Date of Patent: Oct. 21, 2008

(54) MULTI-PURPOSE POLY EDGE TEST STRUCTURE

(75) Inventors: Wen Shi, Shanghai (CN); Wei Wei Ruan, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 29 days.

(21) Appl. No.: 11/728,050

(22) Filed: Mar. 22, 2007

(65) Prior Publication Data

US 2008/0128692 A1 Jun. 5, 2008

(30) Foreign Application Priority Data

Dec. 5, 2006 (CN) .................... 2006 1 0119377

(51) Int. Cl.
*H01L 23/58* (2006.01)

(52) U.S. Cl. ............... 257/48; 257/529; 257/E21.523; 257/E23.149

(58) Field of Classification Search ............ 257/48, 257/E21.523

See application file for complete search history.

(56) References Cited

U.S. PATENT DOCUMENTS 6,133,054 A * 10/2000 Henson .................. 438/17

* cited by examiner

*Primary Examiner*—Tu-Tu V Ho
(74) *Attorney, Agent, or Firm*—Townsend and Townsend and Crew LLP (57) ABSTRACT

A test structure in accordance with the present invention allows for testing of both $V_{bd}$, TDDB, and leakage current between adjacent gate features. The test structure comprises a plurality of parallel polysilicon gate structures overlying a substrate. Traces placing alternate gates in electrical communication with a polysilicon edge are connected by a fuse. In one embodiment, a potential difference is applied across all gates to trigger $V_{bd}$, and then the fuse is broken to allow individual probing of breakdown of the alternate groups of gates. In another embodiment, the fuse is broken and then force and sense voltages are applied to the edge polysilicon in communication with the alternate gate groupings, allowing detection of leakage current between the alternate groupings of gates that reveals the existence of an unwanted polysilicon extrusion or bridge.

16 Claims, 8 Drawing Sheets

MULTI-PURPOSE POLY EDGE TEST STRUCTURE

CROSS-REFERENCE TO RELATED APPLICATION

The instant nonprovisional patent application claims priority to Application No. 200610119377.4, filed in the People's Republic of China on Dec. 5, 2006 and incorporated by reference in its entirety herein for all purposes.

BACKGROUND OF THE INVENTION

The present invention is directed to integrated circuits and their processing for the manufacture of semiconductor devices. More particularly, the invention provides a method and device for manufacturing a metal inter-connect structure exhibiting reduced defects. Merely by way of example, the invention has been applied to a copper metal damascene structure such as a dual damascene structure for advanced signal processing devices. But it would be recognized that the invention has a much broader range of applicability. For example, the invention can be applied to microprocessor devices, memory devices, application specific integrated circuit devices, as well as various other interconnect structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to form safe oxide layers of a predetermined thickness for MOSFET transistor structures.

Figure 1A:
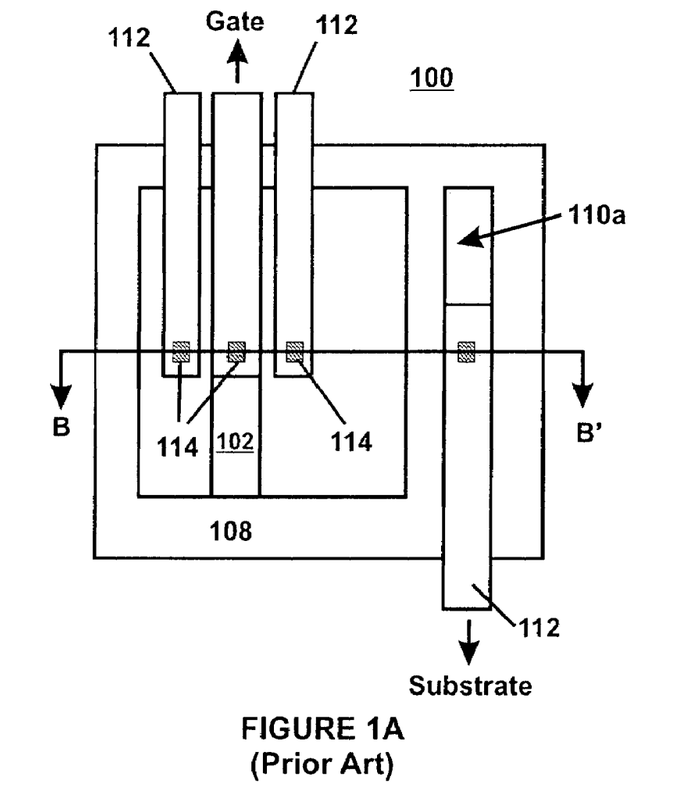
FIG. 1A shows a simplified plan view of a MOSFET device.
Figure 1B:
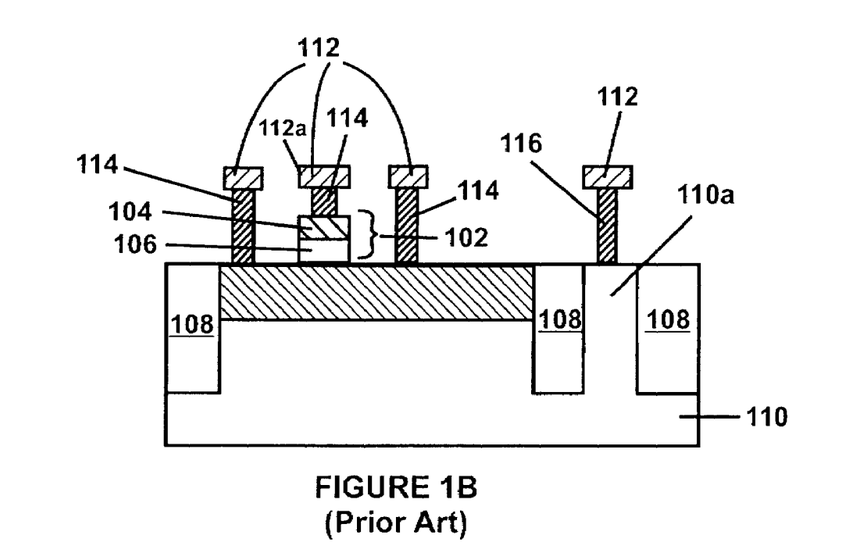
FIG. 1B shows a simplified cross sectional view of the MOSFET device of FIG. 1A, taken along line B-B'.

FIG. 1A shows a simplified plan view of a conventional MOSFET transistor device. FIG. 1B shows a simplified cross-sectional view of the conventional MOSFET device of FIG. 1A.

Conventional MOSFET transistor 100 includes gate 102 comprising conducting polysilicon 104 overlying thin gate dielectric 106. Gate 102 is surrounded by shallow trench isolation (STI) structure 108.

Gate polysilicon 104 and peripheral portions 110a of the substrate 110 are in electrical communication with overlying metallization 112 through via contacts 114. The substrate 110 is also in electrical communication with metallization 112 through contact 116.

FIG. 1B is simplified in that gate drive 106 is typically very thin relative to the overlying gate polysilicon 104. During the course of operation of MOSFET device 100, the application of potential differences between gate contact 114 and substrate contact 116 imposes stress on the thin gate dielectric 106.

Accordingly, one important mechanism of breakdown of the MOSFET device is the unwanted surge of current from gate polysilicon 104 across the thin gate dielectric 106 into the substrate. The voltage at which this failure occurs is known as the breakdown voltage ($V_{bd}$). The mechanism by which this failure occurs over time is known as Time Dependent Dielectric Breakdown (TDDB).

During fabrication of the chip, $V_{bd}$ and TDDB are not typically measured utilizing active portions of the integrated circuit. Instead, a test structure having no active functionality is intentionally created on the chip. Voltages are then applied to the test structure to determine $V_{bd}$ and TDDB.

Figure 2:
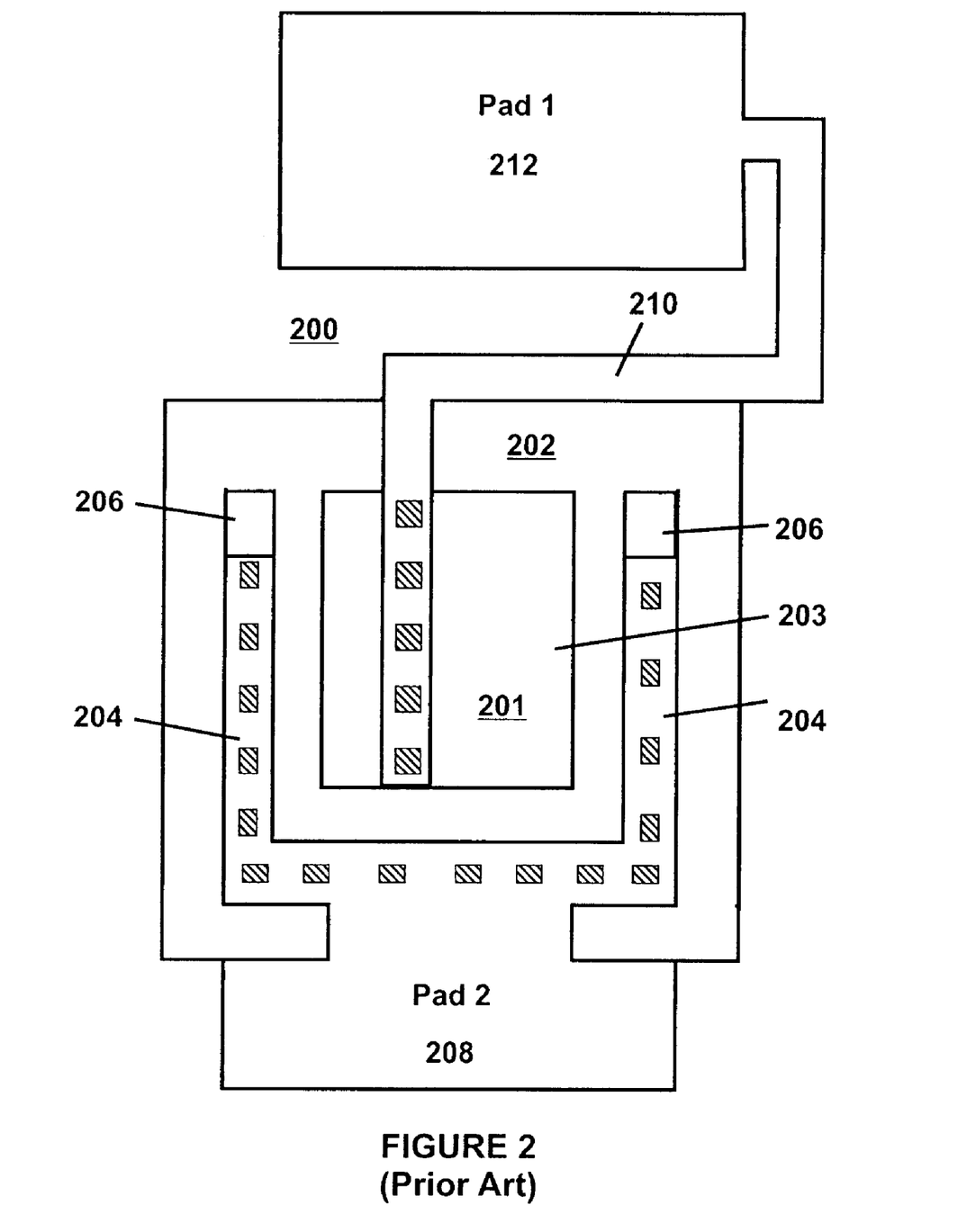
FIG. 2 shows a simplified plan view of a conventional test structure for $V_{bd}$ and TDDB of a MOSFET.

FIG. 2 shows a simplified plan view of a conventional test structure 200 for $V_{bd}$ and TDDB. Active area 201 in the substrate 203 is surrounded by STI 202. Trace 204 is in electrical communication with the underlying substrate 203 through contact with window 206, and with edge polysilicon pad 208. Trace 210 is in electrical communication with the gate polysilicon, and in electrical communication with edge polysilicon pad 212. Application of a potential difference between edge polysilicon pads 208 and 212 would allow for testing of $V_{bd}$ and TDDB based upon the character of the patterned gate dielectric and overlying polysilicon gate.

While the conventional test structure shown in FIG. 2 is effective to show breakdown of the gate oxide, it is not able to provide information regarding actual location of the breakdown event. Moreover, the conventional test structure is limited to testing the $V_{bd}$ and TDDB properties just discussed.

From the above, it is seen that improved techniques and structures for testing semiconductor devices is desired.

BRIEF SUMMARY OF THE INVENTION

A test structure in accordance with the present invention allows for testing of $V_{bd}$, TDDB, and leakage current between adjacent gate features. The test structure comprises a plurality of parallel polysilicon gate structures overlying a substrate. Traces placing alternate gates in electrical communication with a polysilicon edge are connected by a fuse. In one embodiment, a potential difference is applied across all gates to trigger $V_{bd}$, and then the fuse is broken to allow individual probing of breakdown of the alternate groups of gates. In another embodiment, the fuse is broken and then force and sense voltages are applied to the edge polysilicon in communication with the alternate gate groupings, allowing detection of leakage current between the alternate groupings of gates that reveals the existence of an unwanted polysilicon extrusion or bridge.

An embodiment of a test structure in accordance with the present invention comprises a first conducting pad configured to be in electrical communication with a first polysilicon gate structure comprising a gate oxide overlying a doped silicon substrate, and a second conducting pad configured to be in electrical communication with a second polysilicon gate structure comprising a gate oxide overlying the doped silicon substrate. A conducting fuse portion lies between the first conducting pad and the second conducting pad. A third conducting pad is configured to be in electrical communication with the doped silicon substrate.

An embodiment of a test method in accordance with the present invention comprises providing on a substrate a test structure comprising, a first conducting pad in electrical communication with a first polysilicon gate structure comprising a gate oxide overlying a doped silicon substrate, a second conducting pad in electrical communication with a second polysilicon gate structure comprising a gate oxide overlying the doped silicon substrate, a conducting fuse portion between the first conducting pad and the second conducting pad, and a third conducting pad in electrical communication with the doped silicon substrate. The third conducting pad is grounded, and then a first voltage is applied to one of the first conducting pad and the second conducting pad to trigger breakdown of the gate oxide of one of the first gate structure and the second gate structure. The fuse is broken, and a second voltage is applied to one of the first conducting pad and the second conducting pad to identify a location of the gate oxide breakdown.

An alternative embodiment of a test method in accordance with the present invention comprises providing on a substrate a test structure comprising, a first conducting pad in electrical communication with a first polysilicon gate structure comprising a gate oxide overlying a doped silicon substrate, a second conducting pad in electrical communication with a second polysilicon gate structure comprising a gate oxide overlying the doped silicon substrate, a conducting fuse portion between the first conducting pad and the second conducting pad, and a third conducting pad in electrical communication with the doped silicon substrate. The fuse is broken, and a force voltage is applied to one of the first conducting pad and the second conducting pad. A voltage is sensed at the other of the first conducting pad and the second conducting pad to identify leakage between the first polysilicon gate structure and the second polysilicon gate structure.

Various additional objects, features and advantages of the present invention can be more fully appreciated with reference to the detailed description and accompanying drawings that follow.

DETAILED DESCRIPTION OF THE INVENTION

A test structure in accordance with the present invention allows for testing of $V_{bd}$ and TDDB, and leakage current between adjacent gate features. The test structure comprises a plurality of parallel polysilicon gate structures overlying a substrate. Traces placing alternate gates in electrical communication with a polysilicon edge are connected by a fuse. In one embodiment, a potential difference is applied across all gates to trigger $V_{bd}$, and then the fuse is broken to allow individual probing of breakdown of the alternate groups of gates. In another embodiment, the fuse is broken and then force and sense voltages are applied to the edge polysilicon in communication with the alternate gate groupings, allowing detection of leakage current between the alternate groupings of gates.

Figure 3:
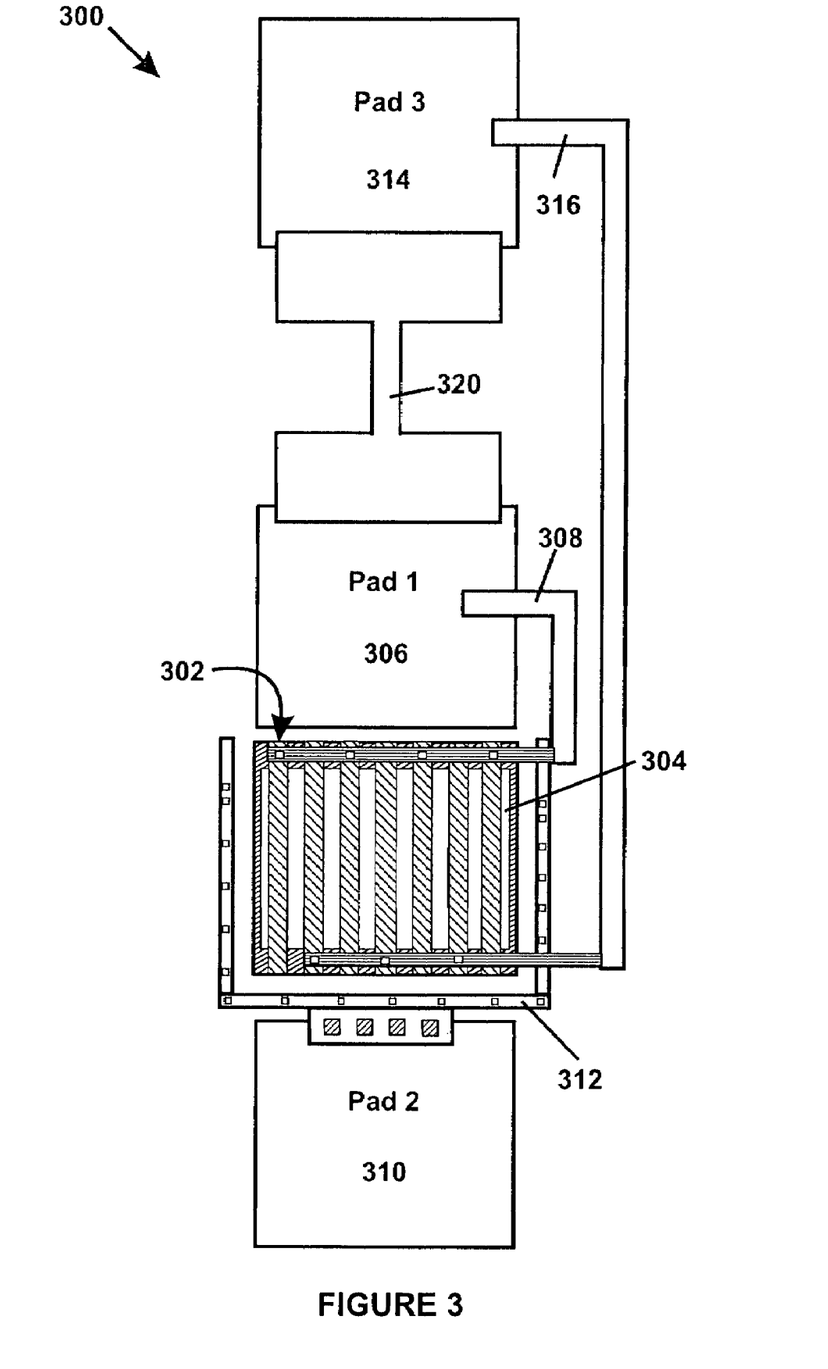
FIG. 3 shows a simplified plan view of one embodiment of a test structure in accordance with the present invention.
Figure 3A:
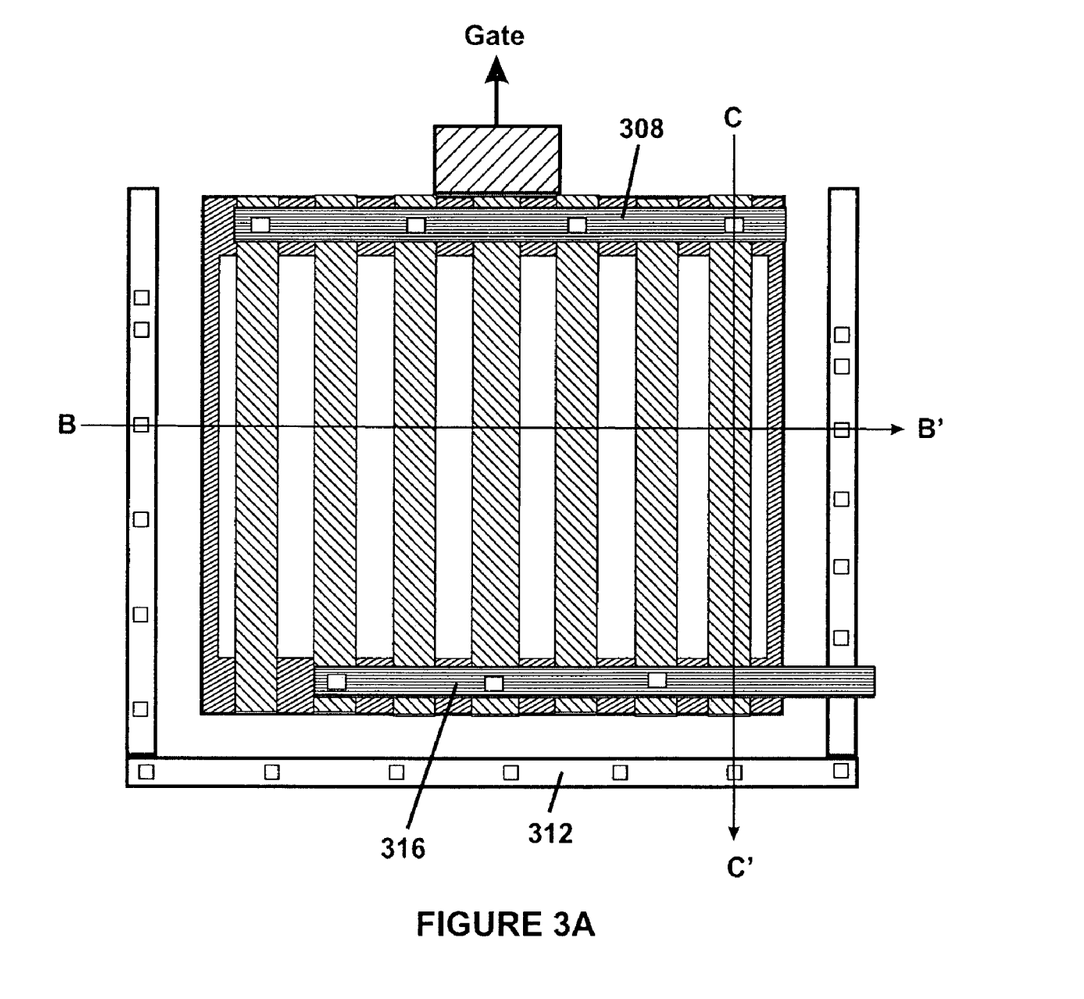
FIG. 3A shows an enlarged view of a portion of the test structure embodiment of FIG. 3A.
Figure 3B:
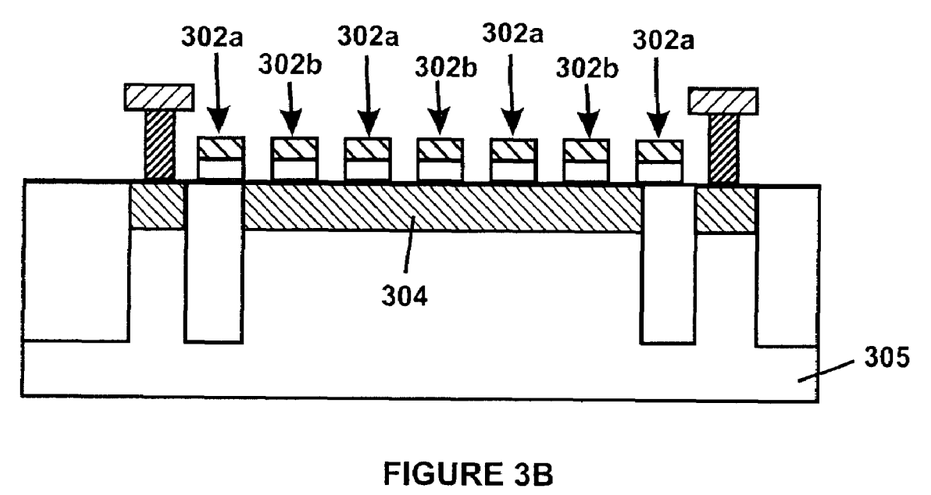
FIG. 3B shows a simplified cross-sectional view of the enlarged portion of the test structure of FIG. 3A, taken along line B-B'.'
Figure 3C:
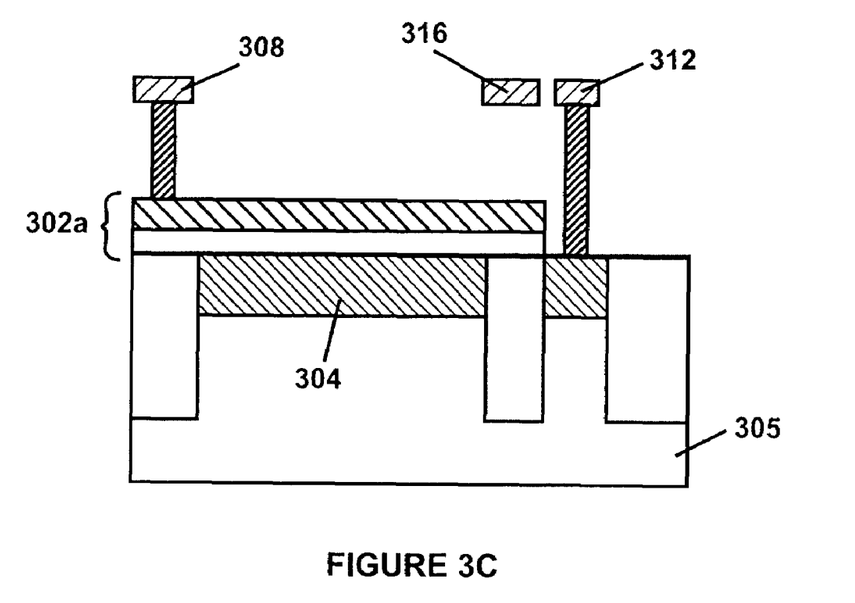
FIG. 3C shows a simplified cross-sectional view of the enlarged portion of the test structure of FIG. 3A, taken along line C-C'.

FIG. 3 shows a simplified plan view of one embodiment of a test structure in accordance with the present invention. FIG. 3A shows an enlarged view of a portion of the test structure embodiment of FIG. 3. FIG. 3B shows a simplified cross-sectional view of the enlarged portion of the test structure of FIG. 3A, taken along line B-B'. FIG. 3C shows a simplified cross-sectional view of the enlarged portion of the test structure of FIG. 3A, taken along line C-C'.

Test structure 300 comprises a series of polysilicon gate structures 302 formed overlying a doped region 304 in substrate 305. These gates are typically formed by etch patterning a polysilicon layer over a thin oxide layer, utilizing photolithography masking techniques.

Doped region 304 may comprise either N-type dopant or P-type dopant. These dopants are typically introduced into the substrate by ion implantation.

First conducting pad 306 is in electrical communication with a first alternating group 302a of gates 302 through first conducting line 308. Conducting line 308 may be formed form metal or polysilicon lines, and may contact the gates and pad through conducting via structures. Conducting pad 306 is also in electrical communication with a first polysilicon edge portion, to facilitate the application of test voltages thereto.

Second conducting pad 310 is in electrical communication with the substrate 305 through second conducting line 312. Second conducting pad 310 may be grounded during testing.

Third conducting pad 314 is in electrical communication with the second group of alternating gates 302b through third conducting line 316. Conducting line 314 may be formed form metal or polysilicon lines, and may contact the gates and pad through conducting via structures. Conducting pad 314 is also in electrical communication with a second polysilicon edge portion, to facilitate the application of test voltages thereto.

First conducting pad 306 and third conducting pad 314 are in selective electrical communication with each other through fuse region 320. Fuse region 320 comprises a constricted or narrow conducting region prone to overheating and fracture under the application of large potential differences thereacross. Alternatively, fuse 320 can be broken by the application of radiation from an external source, for example a laser beam.

Figure 4A:
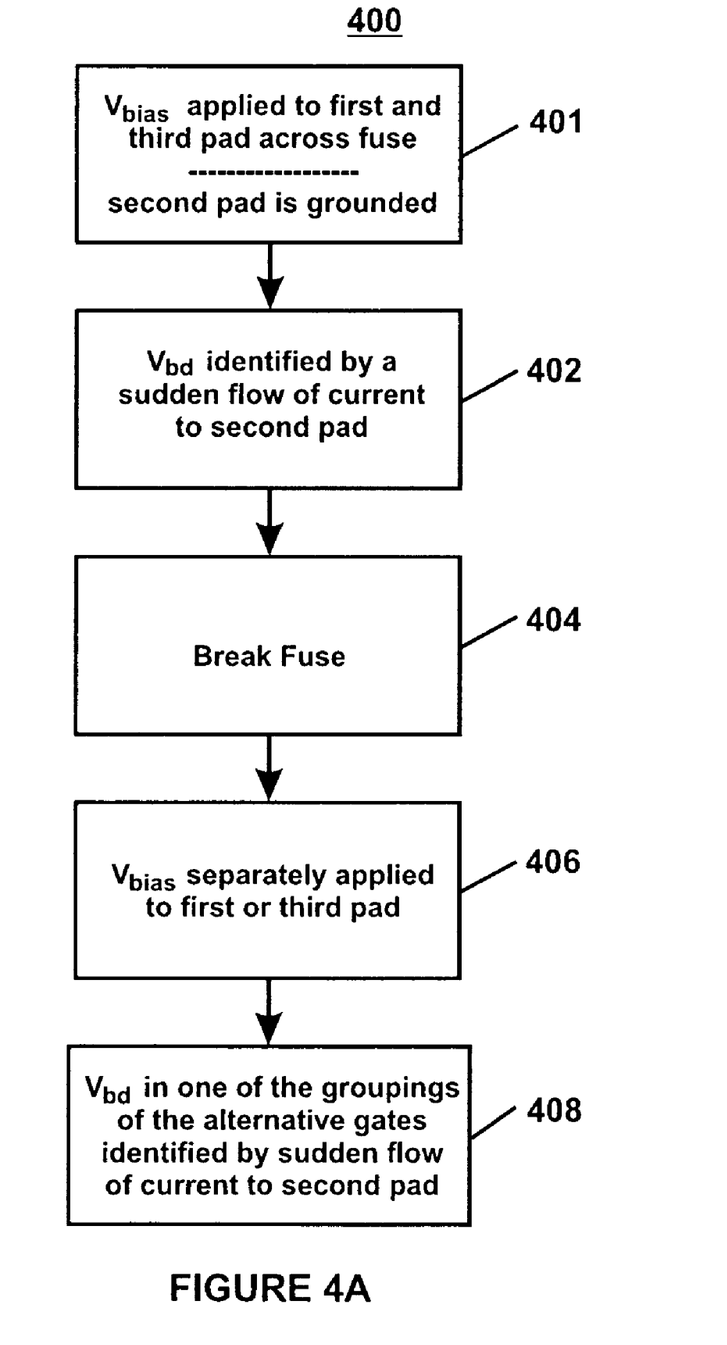
FIG. 4A shows a simplified flow chart of one embodiment of a method of testing a semiconductor device in accordance with the present invention.
Figure 4B:
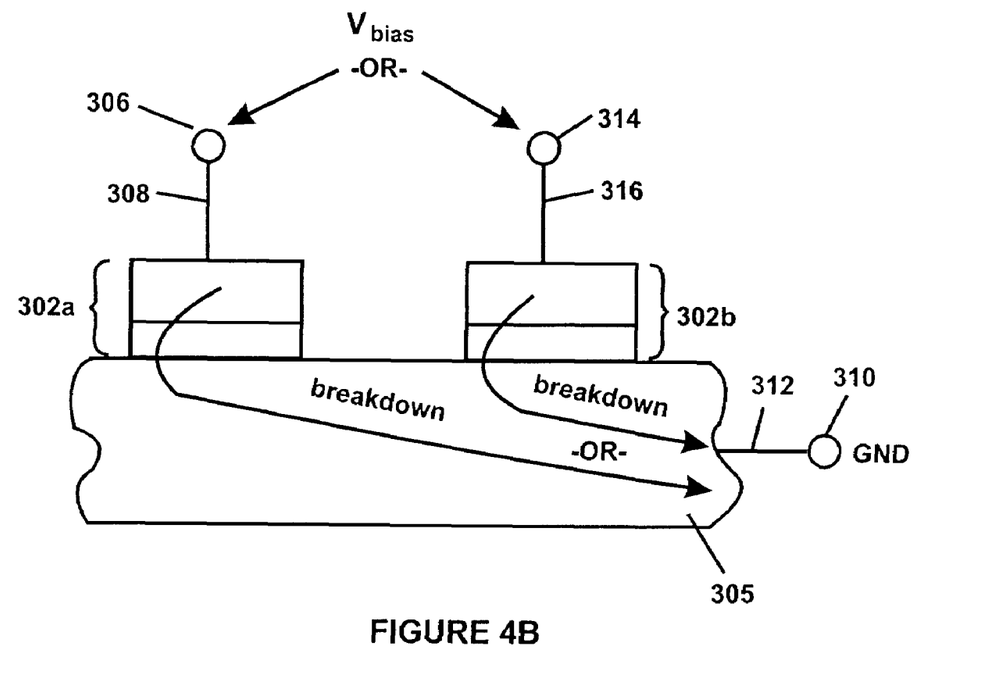
FIG. 4B shows a simplified schematic view of the test structure of FIG. 3 undergoing the method described in FIG. 4A.

The test structure of FIGS. 3-3D can be utilized to determine the magnitude of absolute voltage breakdown ($V_{bd}$) and time dependent dielectric breakdown (TDDB) for the gate structure. FIG. 4A shows a simplified flow chart of one embodiment of a method of testing a semiconductor device in accordance with the present invention. FIG. 4B shows a simplified schematic view of the test structure of FIGS. 3-3C undergoing the method described in FIG. 4A.

In a first step 401 of process flow 400, a high electrical bias ($V_{bias}$) is applied to either first pad 306 or third pad 314. Second pad 310 is grounded.

As first pad 306 and third pad 314 are in electrical communication through fuse 320, the high bias voltage is applied to both of alternating groups 302a and 302b of the gates 302. This applied bias stresses the gate oxide layer lying between the polysilicon gates and the underlying doped silicon.

In step 402, $V_{bd}$ of the gate structures is determined by identifying a sudden flow of current between pads 306/314 and grounded pad 310. The applied high bias may be varied over time to determine $V_{bd}$, or maintained constant over time in order to induce TDDB of the gate oxide.

Additional information regarding occurrence of the breakdown in the gate oxide can be obtained utilizing the test structure. Specifically, in step 404 a very high voltage can be applied across pads 306 and 314 to break the fuse 320. Alternatively, a laser beam or other form of radiation may be applied to break the fuse.

In the next step 406, a high bias voltage can separately be applied to stress pad 306 or pad 314, while maintaining pad 310 grounded. In step 408, detection of a flow of current through one of the first or second alternate gate groupings 302a or 302b reveals the specific location of the defect leading to breakdown of the gate oxide, in one of these gate groupings.

Figure 5A:
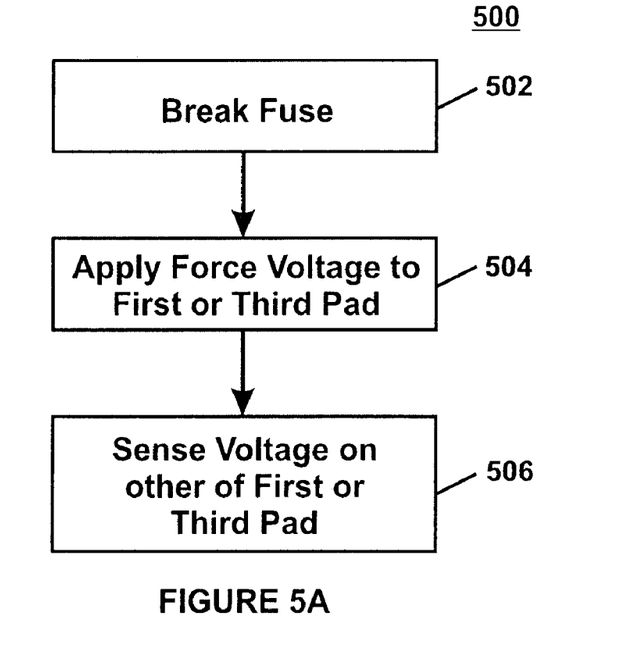
FIG. 5A shows a simplified flow chart of another embodiment of a method of testing a semiconductor device in accordance with the present invention.
Figure 5B:
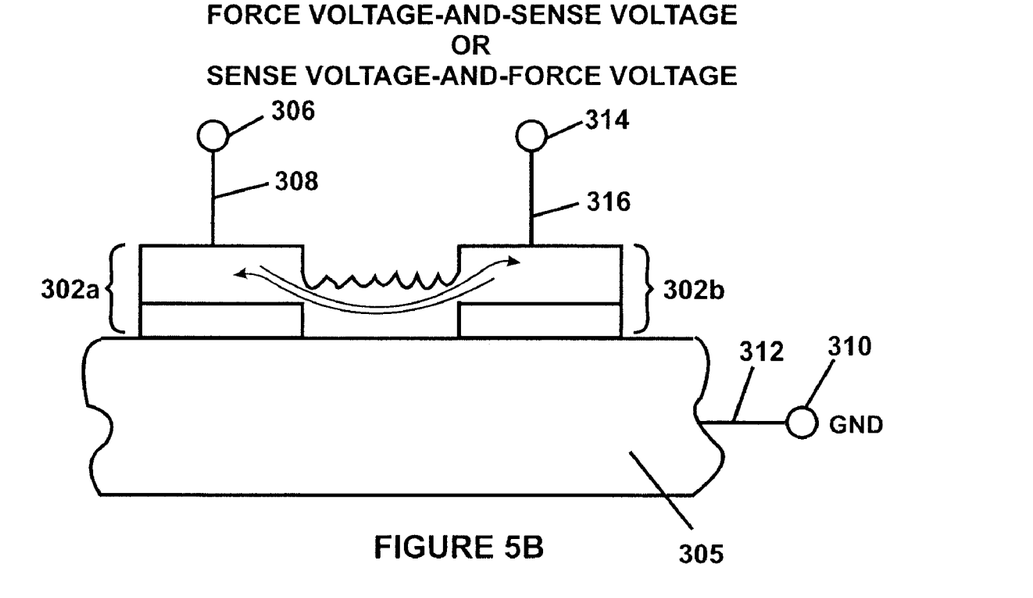
FIG. 5B shows a simplified schematic view of the test structure of FIG. 3 undergoing the method of FIG. 5A.

The test structure of FIGS. 3-3C can also be utilized to determine integrity of the polysilicon component of the gates. FIG. 5A shows a simplified flow chart of another embodiment of a method of testing a semiconductor device in accordance with the present invention. FIG. 5B shows a simplified schematic view of the test structure of FIGS. 3-3C undergoing the method of FIG. 5A.

In a first step 502 of process flow 500, a high bias is applied between first pad 306 and third pad 314 to break the fuse 320 therebetween. This step serves to electrically isolate the alternate groupings 302a and 302b of the polysilicon gates 302.

In a second step 504, one of the two groups 302a or 302b of alternating polysilicon gates 302 is subjected to a high electrical bias, by applying a voltage to either first pad 306 or third pad 314 (the force pad). In third step 506, At the same time, voltage on the other of the alternating groups 302b or 302a of polysilicon gates 302 is detected by monitoring the voltage of the other of first pad 306 and third pad 314 (the sense pad). The existence of such a sense voltage reveals leakage between the polysilicon of the different alternate gate groupings. Such leakage may indicate the presence of an unwanted feature, such as an extrusion or bridge (shown as reference number 390 in FIG. 5B) between adjacent polysilicon gates.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A test structure comprising:
   a first conducting pad configured to be in electrical communication with a first polysilicon gate structure comprising a gate oxide overlying a doped silicon substrate;
   a second conducting pad configured to be in electrical communication with a second polysilicon gate structure comprising a gate oxide overlying the doped silicon substrate;
   a conducting fuse portion between the first conducting pad and the second conducting pad; and
   a third conducting pad configured to be in electrical communication with the doped silicon substrate.

2. The test structure of claim 1 wherein the first polysilicon gate comprises a series of parallel gate structures alternating with a series of parallel gate structures of the second polysilicon gate.

3. The test structure of claim 1 wherein the doped silicon substrate comprises P-type dopant.

4. The test structure of claim 1 wherein the doped silicon substrate comprises N-type dopant.

5. The test structure of claim 1 wherein the fuse comprises a constricted electrically conducting line.

6. The test structure of claim 1 wherein the first conducting pad is configured to be in electrical communication with a first polysilicon edge portion.

7. The test structure of claim 1 wherein the second conducting pad is in configured to be in electrical communication with a second polysilicon edge portion.

8. A test method comprising:
   providing on a substrate a test structure comprising,
      a first conducting pad in electrical communication with a first polysilicon gate structure comprising a gate oxide overlying a doped silicon substrate,
      a second conducting pad in electrical communication with a second polysilicon gate structure comprising a gate oxide overlying the doped silicon substrate,
      a conducting fuse portion between the first conducting pad and the second conducting pad, and
      a third conducting pad in electrical communication with the doped silicon substrate;
   grounding the third conducting pad;
   applying a first voltage to one of the first conducting pad and the second conducting pad to trigger breakdown of the gate oxide of one of the first gate structure and the second gate structure;
   breaking the fuse; and
   applying a second voltage to one of the first conducting pad and the second conducting pad to identify a location of the gate oxide breakdown.

9. The test method of claim 8 wherein the fuse is broken by applying a third, high voltage to the first conducting pad and the second conducting pad.

10. The test method of claim 8 wherein the fuse is broken by application of a beam of radiation to the fuse.

11. The test method of claim 8 wherein the first voltage is applied to a first plurality of parallel polysilicon gate structures, and the second voltage is applied to a second plurality of parallel polysilicon gate structures that alternate with the first plurality of polysilicon gate structures.

12. A test method comprising:
   providing on a substrate a test structure comprising,
      a first conducting pad in electrical communication with a first polysilicon gate structure comprising a gate oxide overlying a doped silicon substrate,
      a second conducting pad in electrical communication with a second polysilicon gate structure comprising a gate oxide overlying the doped silicon substrate,
      a conducting fuse portion between the first conducting pad and the second conducting pad, and
      a third conducting pad in electrical communication with the doped silicon substrate;
   breaking the fuse;
   applying a force voltage to one of the first conducting pad and the second conducting pad; and sensing a voltage at the other of the first conducting pad and the second conducting pad to identify leakage between the first polysilicon gate structure and the second polysilicon gate structure.

13. The test method of claim 12 wherein the fuse is broken by applying a high voltage to the first conducting pad and the second conducting pad.

14. The test method of claim 12 wherein the fuse is broken by application of a beam of radiation to the fuse.

15. The test method of claim 12 wherein the force voltage is applied to one of a first plurality of parallel polysilicon gate structures and a second plurality of parallel polysilicon gate structures that alternate with the first plurality of polysilicon gate structures, and wherein the voltage is sensed at the other of the first plurality of parallel polysilicon gate structures and the second plurality of the parallel polysilicon gate structures.

16. The test method of claim 12 wherein the force voltage is applied to a first polysilicon edge region in electronic communication with the one of the first plurality of parallel polysilicon gate structures and a second plurality of parallel polysilicon gate structures that alternate with the first plurality of polysilicon gate structures, and the voltage is sensed at a second polysilicon edge region in electronic communication with the other of the first plurality of parallel polysilicon gate structures and the second plurality of the parallel polysilicon gate structures.

\* \* \* \* \*